(12) United States Patent
Pieterse et al.

(10) Patent No.: US 10,324,384 B2
(45) Date of Patent: Jun. 18, 2019

(54) LITHOGRAPHIC APPARATUS AND A METHOD OF MANUFACTURING A LITHOGRAPHIC APPARATUS

(71) Applicant: ASML NETHERLANDS B.V., Veldhoven (NL)

(72) Inventors: Gerben Pieterse, Eindhoven (NL); Theodorus Wilhelmus Polet, Geldrop (NL); Johannes Jacobus Matheus Baselmans, Oirschot (NL); Willem Jan Bouman, Moergestel (NL); Theodorus Marinus Modderman, Nuenen (NL); Cornelius Maria Rops, Waalre (NL); Bart Smeets, Bilzen (BE); Koen Steffens, Veldhoven (NL); Ronald Van Der Ham, Maarheeze (NL)

(73) Assignee: ASML Netherlands B.V., Veldhoven (NL)

(*) Notice: Subject to any disclaimer, the term of this patent is extended or adjusted under 35 U.S.C. 154(b) by 154 days.

(21) Appl. No.: 15/320,300

(22) PCT Filed: Jun. 4, 2015

(86) PCT No.: PCT/EP2015/062525
§ 371 (c)(1),
(2) Date: Dec. 19, 2016

(87) PCT Pub. No.: WO2016/000903
PCT Pub. Date: Jan. 7, 2016

(65) Prior Publication Data
US 2018/0210350 A1 Jul. 26, 2018

(30) Foreign Application Priority Data
Jul. 1, 2014 (EP) .................................... 14175307

(51) Int. Cl.
*G03F 7/20* (2006.01)

(52) U.S. Cl.
CPC ...... *G03F 7/70891* (2013.01); *G03F 7/70316* (2013.01); *G03F 7/70341* (2013.01)

(58) Field of Classification Search
CPC .................................................. G03F 7/70341
See application file for complete search history.

(56) References Cited

U.S. PATENT DOCUMENTS

| 8,134,685 B2 | 3/2012 | Nishii et al. |
| 8,233,139 B2 | 7/2012 | Nishii |
| (Continued) | | |

FOREIGN PATENT DOCUMENTS

| JP | 2004-259966 | 9/2004 |
| JP | 2005-252247 | 9/2005 |
| (Continued) | | |

OTHER PUBLICATIONS

International Search Report dated Jan. 7, 2016 in corresponding International Patent Application No. PCT/EP2015/062525.

(Continued)

Primary Examiner — Steven Whitesell Gordon
(74) Attorney, Agent, or Firm — Pillsbury Winthrop Shaw Pittman LLP

(57) ABSTRACT

An immersion lithographic apparatus including: a liquid confinement structure configured to supply and confine immersion liquid to an immersion space between a final lens element of a projection system and a surface of the substrate and/or of a substrate table; and a passageway-former between the projection system and the liquid confinement structure, and a passageway between the passageway-former and an optically active part of the final lens element, the passageway being in liquid communication via an opening with the immersion space and extending radially outwardly, with respect to an optical axis of the projection system, at least to an edge of an exposed bottom surface of the final (Continued)

lens element and being constructed and configured such that in use it is filled with liquid from the immersion space by capillary action.

20 Claims, 10 Drawing Sheets

(56) References Cited

U.S. PATENT DOCUMENTS

| | | | |
|---|---|---|---|
| 8,896,806 B2 | 11/2014 | Sato | |
| 9,176,371 B2 | 11/2015 | Bruijstens et al. | |
| 9,316,921 B2 | 4/2016 | Kobayashi et al. | |
| 2005/0259234 A1* | 11/2005 | Hirukawa | G03F 7/70341 355/53 |
| 2005/0263068 A1* | 12/2005 | Hoogendam | G03F 7/70341 118/668 |
| 2006/0197927 A1* | 9/2006 | Mulkens | G03F 7/70341 355/30 |
| 2007/0081140 A1 | 4/2007 | Beckers et al. | |
| 2008/0233512 A1 | 9/2008 | Nishii et al. | |
| 2009/0103062 A1 | 4/2009 | Van De Kerkhof et al. | |
| 2009/0147225 A1* | 6/2009 | Woo | G03F 7/70341 355/27 |
| 2009/0168032 A1 | 7/2009 | Kate et al. | |
| 2009/0280436 A1 | 11/2009 | Nishii | |
| 2010/0066987 A1* | 3/2010 | Bruijstens | G03B 27/52 355/30 |
| 2010/0304310 A1* | 12/2010 | Sato | G03F 7/70916 430/325 |
| 2014/0055763 A1 | 2/2014 | Kobayashi et al. | |

FOREIGN PATENT DOCUMENTS

| | | |
|---|---|---|
| JP | 2006-016500 | 1/2006 |
| JP | 2007-110109 | 4/2007 |
| JP | 2009-141357 | 6/2009 |
| JP | 2009-164573 | 7/2009 |
| JP | 2009-536452 | 10/2009 |
| JP | 2010-074160 | 4/2010 |

OTHER PUBLICATIONS

Japanese Office Action issued in corresponding Japanese Patent Application No. 2016-574391, dated Mar. 1, 2018, with English translation, 11 pages.

* cited by examiner

LITHOGRAPHIC APPARATUS AND A METHOD OF MANUFACTURING A LITHOGRAPHIC APPARATUS

CROSS-REFERENCE TO RELATED APPLICATIONS

This application is the U.S. national phase entry of PCT patent application no. PCT/EP2015/062525, which was filed on Jun. 4, 2015, which claims the benefit of priority of European EP patent application no. 14175307.9, which was filed on Jul. 1, 2014, and which is incorporated herein in its entirety by reference.

FIELD

The present invention relates to a lithographic apparatus and a method of manufacturing a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction.

In an immersion apparatus, a liquid is confined to an immersion space by a liquid confinement structure. The immersion space is between a final lens element of a projection system through which the pattern is imaged and the substrate onto which the pattern is transferred or a substrate table on which the substrate is held. The liquid may be confined to the immersion space by a fluid seal. The liquid confinement structure may create or use a flow of gas, for example to help in controlling the flow and/or the position of the liquid in the immersion space. The flow of gas may form the seal to confine the liquid to the immersion space.

A droplet of liquid or a liquid film (reference hereinafter referring to a droplet also encompasses a film; a film being a droplet covering a larger surface area) from the immersion space may splash onto an exposed bottom surface of the final lens element at a random position which is not normally in contact with liquid in the immersion space. Such a droplet can evaporate. If such a droplet evaporates, a cooling thermal load is applied locally on the final lens element. A local cooling load applied at an unpredefined (or random) position on the final lens element can lead to optical errors, such as one or more of aberrations, other non-correctable imaging and focusing errors, which are unstable within a lot of substrates. Consequently the optical performance may be unpredictably inconsistent over a period of use such as a lot of substrates.

SUMMARY

It is desirable, for example, to provide a system to reduce the effect of a droplet on the final lens element or substantially to avoid such droplet formation.

According to an aspect, there is provided an immersion lithographic apparatus comprising: a projection system for projecting a patterned radiation beam through an optically active part of a final lens element of the projection system towards a substrate supported by a substrate table; a liquid confinement structure configured to supply and confine immersion liquid to an immersion space between the final lens element of the projection system and a surface formed of at least one of the substrate and substrate table; and a passageway-former between the projection system and the liquid confinement structure, and a passageway between the passageway-former and the optically active part of the final lens element, the passageway being in liquid communication via an opening with the immersion space to allow a liquid flow through the passageway to or from the immersion space. In an embodiment, the liquid flow is effective thermally to condition the final lens element.

According to an aspect, there is provided an immersion lithographic apparatus comprising: a projection system for projecting a patterned radiation beam through an optically active part of a final lens element of the projection system towards a substrate supported by a substrate table, the final lens element having an exposed bottom surface; a liquid confinement structure configured to supply and confine immersion liquid to an immersion space between the final lens element of the projection system and a surface formed of at least one of the substrate and substrate table; and a passageway-former between the projection system and the liquid confinement structure, and a passageway between the passageway-former and the optically active part of the final lens element, the passageway being in liquid communication via an opening with the immersion space and extending radially outwardly with respect to an optical axis of the projection system at least to an edge of the exposed bottom surface of the final lens element and being constructed and configured such that in use it is filled with liquid from the immersion space by capillary action.

According to an aspect, there is provided an immersion lithographic apparatus comprising: a projection system for projecting a patterned radiation beam through an optically active bottom surface of a final lens element of the projection system and towards a substrate supported by a substrate table; a liquid confinement structure between the projection system and at least one of the substrate and substrate table, the liquid confinement structure being configured to supply and confine immersion liquid to an immersion space between the final lens element of the projection system and a surface formed of at least one of the substrate and substrate table; and a liquid supply opening radially outward of the optically active bottom surface of the final lens element adapted for the flow there through of a liquid over an exposed bottom surface of the final lens element towards the optically active bottom surface of the final lens element and into the immersion space.

According to an aspect, there is provided an immersion lithographic apparatus comprising: a projection system for projecting a patterned radiation beam through a final lens element of the projection system towards a substrate supported by a substrate table; a liquid confinement structure configured to supply and confine immersion liquid to an immersion space between the final lens element of the projection system and a surface formed of at least one of the substrate and substrate table; and a passageway-former between the projection system and the liquid confinement structure and a passageway between the passageway-former and the final lens element, the passageway being in liquid communication with the immersion space to allow a flow of thermally regulated liquid through the passageway to or from the immersion space thereby to thermally condition the final lens element.

In a first aspect, the present invention relates to an immersion lithographic apparatus comprising: a projection system for projecting a patterned radiation beam through an optically active part of a final lens element of the projection system towards a substrate supported by a substrate table, the final lens element having an exposed bottom surface; a liquid confinement structure configured to supply and confine immersion liquid to an immersion space between the final lens element of the projection system and a surface formed of at least one of the substrate and substrate table; and a passageway-former between the projection system and the liquid confinement structure, and a passageway between the passageway-former and the optically active part of the final lens element, the passageway being in liquid communication via an opening with the immersion space and extending radially outwardly with respect to an optical axis of the projection system at least to an edge of the exposed bottom surface of the final lens element and being constructed and configured such that in use it is filled with liquid from the immersion space by capillary action.

In a second aspect, the passageway-former of the first aspect is integral with the final lens element of the projection system.

In a third aspect, the immersion lithographic apparatus of the first or second aspects further comprises at least one further passageway between the passageway-former and the optically active part of the final lens element.

In a fourth aspect, the present invention relates to an immersion lithographic apparatus comprising: a projection system for projecting a patterned radiation beam through an optically active part of a final lens element of the projection system towards a substrate supported by a substrate table; a liquid confinement structure configured to supply and confine immersion liquid to an immersion space between the final lens element of the projection system and a surface formed of at least one of the substrate and substrate table; and a passageway-former between the projection system and the liquid confinement structure, and a passageway between the passageway-former and the optically active part of the final lens element, the passageway being in liquid communication via an opening with the immersion space to allow a liquid flow through the passageway to or from the immersion space.

In a fifth aspect, the passageway of the fourth aspect extends radially outwardly with respect to an optical axis of the projection system of an edge of an exposed bottom surface of the final lens element.

In a sixth aspect, the passageway-former of the fourth or fifth aspect is integral with the final lens element of the projection system.

In a seventh aspect, the passageway-former of the fourth or fifth aspect is separate from the final lens element of the projection system.

In an eighth aspect, the passageway of the fourth, fifth or seventh aspect is between the passageway-former and a non-optically active part of the final lens element through which the patterned beam of radiation does not pass.

In a ninth aspect, the passageway-former of the fourth, fifth, seventh or eighth aspect is supported by the projection system.

In a tenth aspect, the passageway-former of the ninth aspect is attached to the final lens element.

In an eleventh aspect, the passageway-former of the ninth aspect is attached to a final lens element support which supports the final lens element.

In a twelfth aspect, the passageway-former of the fourth, fifth, seventh or eight aspect is supported by the liquid confinement structure.

In a thirteenth aspect, the passageway-former of the fourth, fifth, seventh or eighth aspect is supported independently of the projection system and liquid confinement structure.

In a fourteenth aspect, the passageway-former of any of the seventh-thirteenth aspects comprises a plurality of spacers in an upper surface facing the final lens element, ends of the spacers being in contact with the final lens element.

In a fifteenth aspect, the immersion lithographic apparatus of any of the seventh-fourteenth aspects further comprises an under pressure source adapted to apply an under pressure on one side of the passageway-former compared to an ambient pressure on the opposite side of the passageway-former thereby to apply an attractive force to the passageway-former towards the projection system.

In a sixteenth aspect, the passageway-former of any of the fourth, fifth, or seventh-fifteenth aspects, at its radially inner most position, relative to an optical axis of the projection system, extends lower than the optically active part of the final lens element.

In a seventeenth aspect, the passageway of any of the fourth-sixteenth aspects is constructed and configured such that in use it is filled with liquid from the immersion space by capillary action.

In an eighteenth aspect, the immersion lithographic apparatus of any of the first-seventeenth aspects further comprises a further opening in liquid communication with the passageway at an end of the passageway opposite to the opening in liquid communication with the immersion space, the further opening being adapted to supply liquid to and/or receive liquid from the passageway.

In a nineteenth aspect, the immersion lithographic apparatus of the eighteenth aspect further comprises a further opening controller adapted to control liquid flow rate through the further opening.

In a twentieth aspect, the further opening controller of the nineteenth aspect is adapted periodically to replenish liquid in the passageway by controlling liquid entering and/or exiting the passageway through the further opening.

In a twenty-first aspect, the further opening controller of the nineteenth or twentieth aspect is adapted to control an under pressure applied to the further opening.

In a twenty-second aspect, the immersion lithographic apparatus of any of the first-twenty-first aspects further comprises a substrate table controller adapted periodically to move the substrate table relative to the projection system in such a way as to force liquid from the immersion space into the passageway thereby to replenish liquid in the passageway.

In a twenty-third aspect, liquid in the immersion space of any of the first-twenty-second aspects has a contact angle of greater than 90° on a facing surface of the passage-way former which faces the liquid confinement structure.

In a twenty-fourth aspect, the contact angle of the twenty-third aspect is greater than 95°.

In a twenty-fifth aspect, the liquid of the twenty-third of twenty-fourth aspect is water and the surface is lyophobic with respect to water.

In a twenty-sixth aspect, the liquid in the immersion space of any of the first-twenty-fifth aspects has a contact angle of less than 90° on at least a part of surfaces forming the passageway.

In a twenty-seventh aspect, the contact angle of the twenty-sixth aspect is less than 85°, desirably less than 70°, more desirably less than 50° or even more desirably less than 30°.

In a twenty-eighth aspect, the liquid of the twenty-seventh aspect is water and the surface is hydrophilic.

In a twenty-ninth aspect, the immersion lithographic apparatus of any of the first-twenty-eighth aspects further comprises a groove in the passageway, the groove extending radially so as to guide liquid towards or away from the immersion space.

In a thirtieth aspect, there is provided an immersion lithographic apparatus comprising: a projection system for projecting a patterned radiation beam through an optically active bottom surface of a final lens element of the projection system and towards a substrate supported by a substrate table; a liquid confinement structure between the projection system and at least one of the substrate and substrate table, the liquid confinement structure being configured to supply and confine immersion liquid to an immersion space between the final lens element of the projection system and a surface formed of at least one of the substrate and substrate table; and a liquid supply opening radially outward of the optically active bottom surface of the final lens element adapted for the flow there through of a liquid over an exposed bottom surface of the final lens element towards the optically active bottom surface of the final lens element and into the immersion space.

In a thirty-first aspect, liquid in the immersion space of the thirtieth aspect has a contact angle of less than 90° on a part of the bottom surface of the final lens element radially outwardly of the optically active bottom surface relative to a optical axis of the projection system.

In a thirty-second aspect, the contact angle of the thirty-first aspect is less than 85°, desirably less than 70°.

In a thirty-third aspect, the liquid of the thirty-first or thirty-second aspect is water and the surface is hydrophobic.

In a thirty-fourth aspect, the liquid supply opening of any of the thirtieth-thirty-third aspects is radially outward with respect to an optical axis of the projection system of an edge of the exposed bottom surface of the final lens element.

In a thirty-fifth aspect, the immersion lithographic apparatus of any of the thirtieth-thirty-fourth aspects further comprises at least one groove in the exposed bottom surface of the final lens element, the groove extending radially so as to guide liquid exiting the liquid supply opening towards the immersion space.

In a thirty-sixth aspect, immersion lithographic apparatus comprising: a projection system for projecting a patterned radiation beam through a final lens element of the projection system towards a substrate supported by a substrate table; a liquid confinement structure configured to supply and confine immersion liquid to an immersion space between the final lens element of the projection system and a surface formed of at least one of the substrate and substrate table; and a passageway-former between the projection system and the liquid confinement structure and a passageway between the passageway-former and the final lens element, the passageway being in liquid communication with the immersion space to allow a flow of thermally regulated liquid through the passageway to or from the immersion space thereby to thermally condition the final lens element.

BRIEF DESCRIPTION OF THE DRAWINGS

The invention will now be described, by way of example only, with reference to the accompanying schematic drawings in which corresponding reference symbols indicate corresponding parts, and in which.

DETAILED DESCRIPTION

Figure 1:
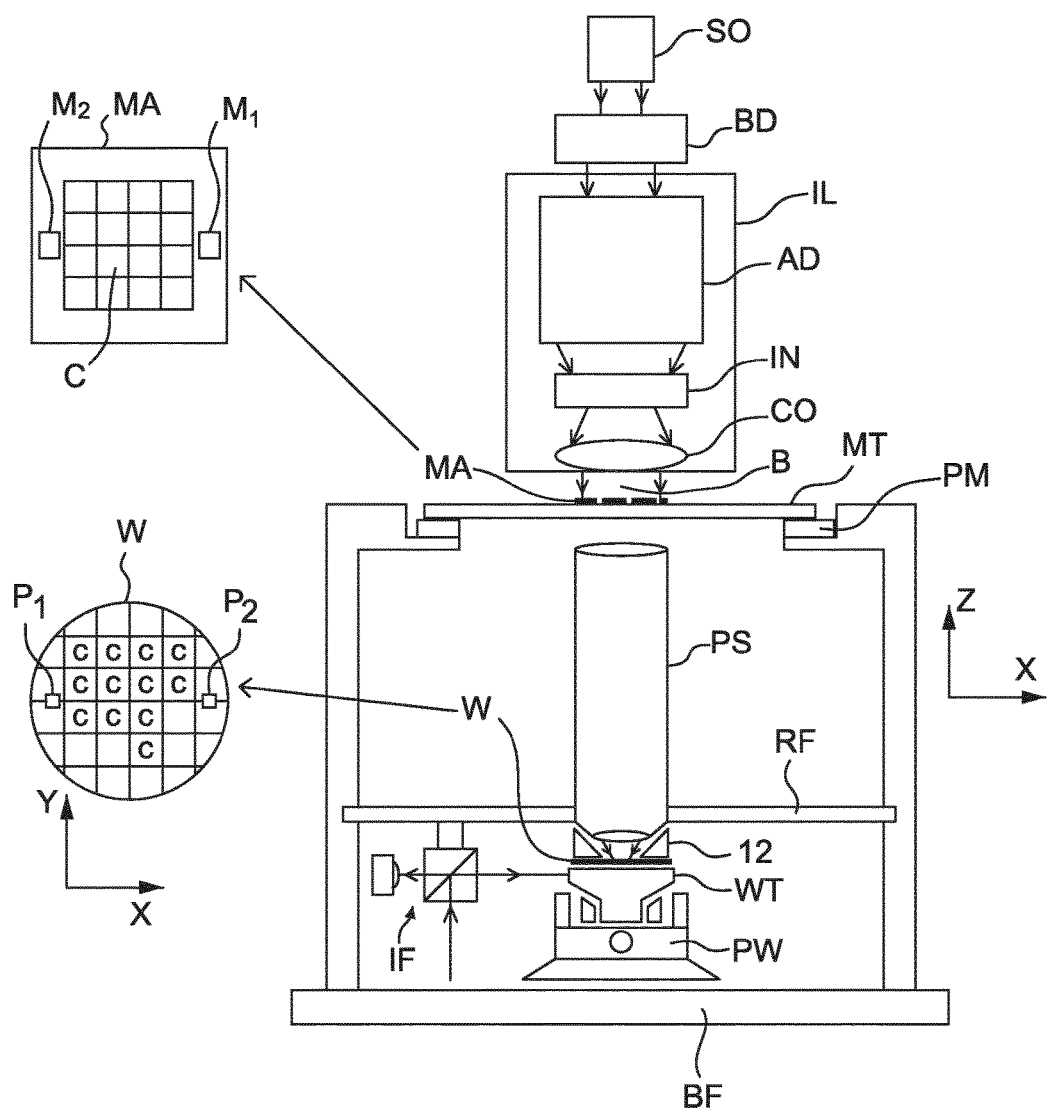
FIG. 1 depicts a lithographic apparatus.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate W. It should be noted that the pattern imparted to the radiation beam B may not exactly correspond to the desired pattern in the target portion of the substrate W, for example if the pattern includes phase-shifting features or so called assist features. Generally, the pattern imparted to the radiation beam B will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more stages or tables. At least one of the tables has a substrate support that can hold a substrate. In an embodiment two or more of the tables each have a substrate support. The lithographic apparatus may have two or more mask tables or "mask supports". In such "multiple stage" machines the additional tables or supports may be used in parallel, or preparatory steps may be carried out on one or more tables or supports while one or more other tables or supports are being used for exposure.

The lithographic apparatus is of a type wherein at least a portion of the substrate may be covered by a liquid having a relatively high refractive index, e.g. water such as ultra pure water (UPW), so as to fill an immersion space between the projection system PS and the substrate W. An immersion liquid may also be applied to other spaces in the lithographic apparatus, for example, between the mask MT and the projection system PS. Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system to the substrate is entirely through liquid.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus. In arrangements where the source is separate from the lithographic apparatus, the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Arrangements for providing liquid between a final lens element of the projection system PS and the substrate can be classed into three general categories. These are the bath type arrangement, the so-called localized immersion systems and the all-wet immersion systems. The present invention relates particularly to the localized immersion systems.

Figure 2:
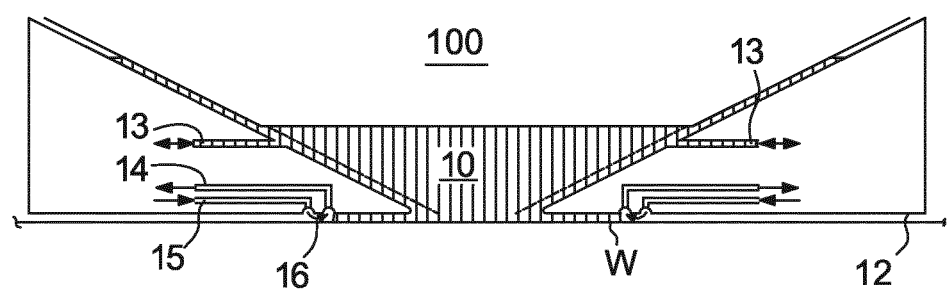
FIG. 2 depicts a liquid confinement structure for use in a lithographic projection apparatus.

In an arrangement which has been proposed for a localized immersion system a liquid confinement structure 12 extends along at least a part of a boundary of an immersion space between the final lens element of the projection system PS and the facing surface of the stage or table facing the projection system. The facing surface of the table is referred to as such because the table is moved during use and is rarely stationary. Generally, the facing surface of the table is a surface of a substrate W, substrate table WT which surrounds the substrate or both. Such an arrangement is illustrated in FIG. 2. The arrangement illustrated in FIG. 2 and described below may be applied to the lithographic apparatus described above and illustrated in FIG. 1.

FIG. 2 schematically depicts the liquid confinement structure 12. The liquid confinement structure 12 extends along at least a part of a boundary of the immersion space 10 between the final lens element 100 of the projection system PS and the substrate table WT or substrate W. In an embodiment, a seal is formed between the liquid confinement structure 12 and the surface of the substrate W/substrate table WT. The seal may be a contactless seal such as a gas seal (such a system with a gas seal is disclosed in European patent application publication no. EP-A-1,420, 298) or a liquid seal.

The liquid confinement structure 12 is configured to supply and confine immersion liquid to the immersion space 10. Liquid is brought into the immersion space 10 by liquid inlet 13. The liquid may be removed by liquid outlet 13.

The liquid may be contained in the immersion space 10 by a gas seal 16 which, during use, is formed between the bottom of the liquid confinement structure 12 and the facing surface of the table (i.e. the surface of the substrate W and/or the surface of the substrate table WT). The gas in the gas seal 16 is provided under pressure via inlet 15 to a gap between the liquid confinement structure 12 and substrate W and/or substrate table WT. The gas is extracted via a channel associated with outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W and/or substrate table WT contains the liquid in the immersion space 10. Such a system is disclosed in United States patent application publication no. US 2004-0207824. Other liquid confinement systems 12 can be used with the present invention.

Figure 3:
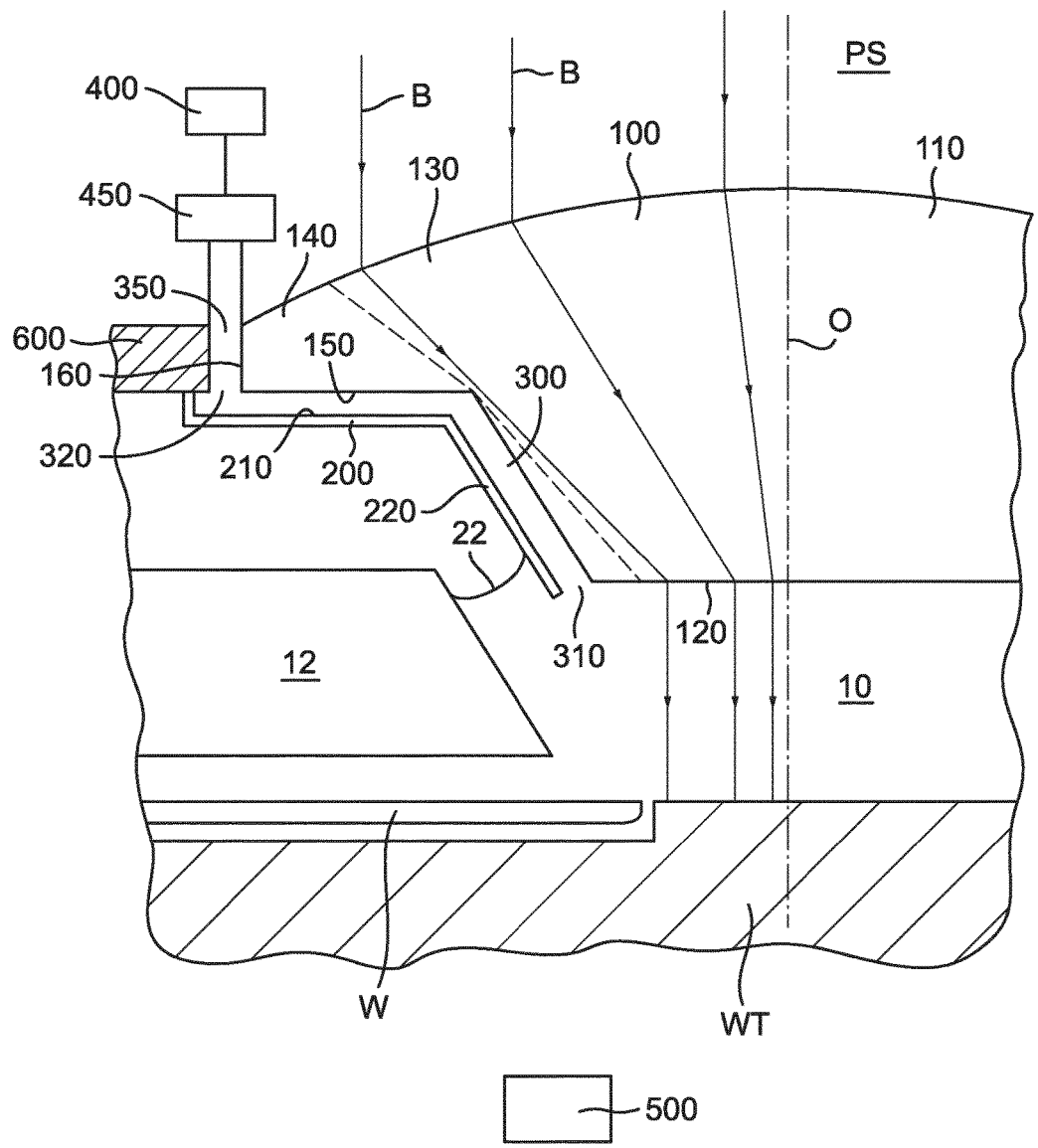
FIG. 3 depicts, in cross-section, a passageway-former according to an embodiment of the present invention.

The final lens element 100 of the projection system PS is depicted, in cross-section, in FIG. 3. At a top surface 110, the final lens element 100 draws in a patterned radiation beam B. The patterned radiation beam B is focused by the final lens element 100. The patterned radiation beam B leaves the final lens element 100 through an optically active bottom surface 120. The patterned radiation beam B passes through an optically active part 130 of the body of the final lens element 100. The optically active part 130 is the part enclosed by the top surface 110, the optically active bottom surface 120 and the dashed lines illustrated in FIG. 3. The optically active bottom surface 120 is the part of the bottom surface of the final lens element 10 through which the patterned projection beam B passes.

Part of the final lens element 100 radially outward of the optically active part 130 is a non-optically active part 140 of the body of the final lens element 100. The patterned radiation beam B does not pass through the non-optically active part 140 of the body of the final lens element 100. Therefore the patterned radiation beam B does not pass through a part of the bottom surface. The part of the bottom surface through which none of the patterned radiation beam B passes is a non-optically active bottom surface 150 of the final lens element 100. Together the optically active bottom surface 120 and non-optically active bottom surface 150 make up an exposed bottom surface of the final lens element 100. The exposed bottom surface of the final lens element 100 is exposed (or bare) in that it is exposed to the external environment. The exposed bottom surface of the final lens element 100 is an uncovered (or naked) surface in that it is uncovered by components of the projection system PS for example by a final lens element support 600.

The exposed bottom surface of the final lens element 100 is a bottom surface of the final lens element 100 to which there may be a direct uninterrupted path from the top surface 120 through material of the final lens element 100. Alternatively or additionally, part of the bottom surface of the final lens element 100 might not be exposed to the external environment. Part of the bottom surface may be covered for example by a support component. The exposed bottom surface of the final lens element 100 is not covered by a final lens element support 600 of the projection system PS.

The liquid in the immersion space is in contact with a part of the exposed bottom surface of the final lens element 100. The part of the exposed bottom surface is the lowest part of the bottom surface. The liquid in the immersion space 10 is in contact with all of the optically active bottom surface 120. The liquid in the immersion space 10 is in contact with a lowest portion of the non-optically active bottom surface 140.

As shown in FIG. 3, a passageway-former 200 is positioned between the projection system PS and the liquid confinement structure 12. The passageway-former 200 has a former facing surface 220 which is a surface facing the liquid confinement structure 12. The passageway-former 200 has an upper surface 210. The upper surface 210 faces the final lens element 100. A meniscus of liquid 22 extends between the liquid confinement structure 12 and the former facing surface 220. The meniscus 22 defines a part of the boundary of the immersion space 10. A gap exist between the former facing surface 220 and the liquid confinement structure 12, particularly between a top surface of the liquid confinement structure 12 and the former facing surface 220.

The passageway-former 200 extends all the way around, in plan, the final lens element 100. In an embodiment the passageway-former 200 is co-axial with the final lens element 100. The passageway-former 200 may be seen as a cup.

A passageway 300 is between the passageway-former 200 and the optically active part 130 of the final lens element 100. The passageway 300 is defined between the upper surface 210 and at least part of the non-optically active surface 150. The passage 300 may extend, in a plane parallel to the facing surface of the substrate table WT, around the periphery of the final lens element 100. In this arrangement there is one passageway defined between the upper surface 210 and at least part of the non-optically active bottom surface 150. As described below, in another arrangement there may be more than one passageway 300, in plan. Taken together the passageways 300 extend, in plan, substantially all the way around the final lens element 100.

The passageway 300 has an opening 310. The opening 310 is at the radially innermost end of the passageway 300 relative to the optically active bottom surface 120, for example the optical axis O of the projection system PS. The opening 310 brings the passageway 300 into liquid communication with the immersion space 10.

The passageway 300 is, in use, filled with liquid. The presence of liquid in the passageway 300 means that any heat load applied to the passageway-former 200 radially outward of the meniscus 22 imparts a lower heat load to the optically active part 130 than would be the case in the absence of the passageway-former 200 and passageway 300. Such a heat load could be applied to the passageway-former 200, for example, by the presence of a droplet of liquid on the former facing surface 220 of the passageway-former 200.

In an embodiment, the passageway 300 (and passageway-former 200) extends radially outwardly (with respect to the optically active bottom surface 120) of an edge 160 of the exposed bottom surface of the final lens element 100. In this way, the whole of the final lens element 100 is protected from heat loads which might result from droplets of liquid on the exposed bottom surface. If the whole of passageway 300 is filled with liquid, there will be no meniscus (or passageway meniscus) of liquid extending in the passageway 300 between the upper surface 210 and non-optically active surface 150. The presence of a passageway meniscus might result in a heat load being applied to the final lens element 100 due to evaporation of liquid at the position of the passageway meniscus on the non-optically active surface 150.

In an embodiment the passageway 300 is co-axial with the final lens element 100. In an embodiment the passageway 300 is such that, except for at locations of spacers or ribs described below, liquid in the passageway 300 or in the immersion space 10 is in contact with all of the exposed bottom surface of the final lens element 100. In an embodiment, no ribs are present and only one passageway 300 extends all the way around the optically active part 130.

The passageway 300 has two ends: a distal end and a proximal end. The proximal end is the closer of the two ends to the optically active bottom surface 120. The opening at the proximal end is the opening 310. The opening at the distal end is a further opening or a distal opening. The further opening 320 is at the opposite end of the passageway 300 to the opening 310. The further opening 320 is radially outward of the opening 310. In an embodiment, the further opening 320 is a radially outermost opening of the passageway 300.

The further opening 320 may be elongate, in plan, and extend all the way around the final lens element 100. Alternatively there could be a plurality of further openings 320. Each of the plurality of further openings 320 may be associated with a passageway 300. The plurality of passageways 300 may be discrete and spaced apart periodically at regular or irregular distances around the final lens element 100, in plan.

In an embodiment the passageway 300 is constructed and configured such that, in use, it is filled with liquid from the immersion space 10 by capillary action. In an embodiment the passageway 300 is sized to allow capillary action to drawn (or suck) liquid out of the immersion space 10 in a radially outwards direction. In an embodiment, the passageway 300 has a minimum dimension in a cross-section of 0.75 mm or less. This dimension allows sufficient capillary force to be generated. Liquid removed from the immersion space 10 by capillary action may exit the passageway 300 through the further opening 320.

In an embodiment a further opening controller 400 may be provided. The further opening controller 400 controls a liquid supply and/or recovery system 450. The liquid supply and/or recovery system 450 supplies and or recovers liquid from the further opening 320. One or more of the further opening controller 400, the liquid supply system and the liquid recovery system may be removed from the projection system PS. They may be housed in a fluid cabinet, separate from projection system PS or even the lithographic apparatus. The liquid supply and/or recovery system 450 may apply an under-pressure to the further opening 320. The under-pressure may be used in addition to capillary forces to remove liquid from the immersion space 10. Alternatively the under-pressure applied by the liquid supply and/or recovery system 300 may be used as an alternative to capillary action to remove liquid through the passageway 300 from the immersion space 10. The under pressure applied to the liquid may be a force larger than the capillary force which would be applied, such that the effective capillary force is in comparison to the under pressure force negligible.

The further opening controller 400 may be adapted to control supply and/or recovery of liquid through the further opening 320 continuously or discontinuously, for example in a periodic fashion. For example, the further opening controller 400 may be adapted periodically to replenish liquid in the passageway 300. In order to avoid vibrations due to liquid flow in the passageway 300 deleteriously effecting imaging of a substrate W, the further opening controller 400 may be adapted to replenish liquid in the passageway 300 between imaging of substrates W or between imaging a lot of substrates. In an embodiment, the further opening controller 400 may be adapted to replenish liquid in the passageway 300 once every few hours or once every day, for example. Replenishing liquid in the passageway 300 helps in maintaining the liquid in the passageway 300 at a constant temperature. Replenishing liquid in the passageway 300 also helps to prevent growth of algae in the liquid in the passageway 300 which might otherwise be a source of contamination.

Figure 4:
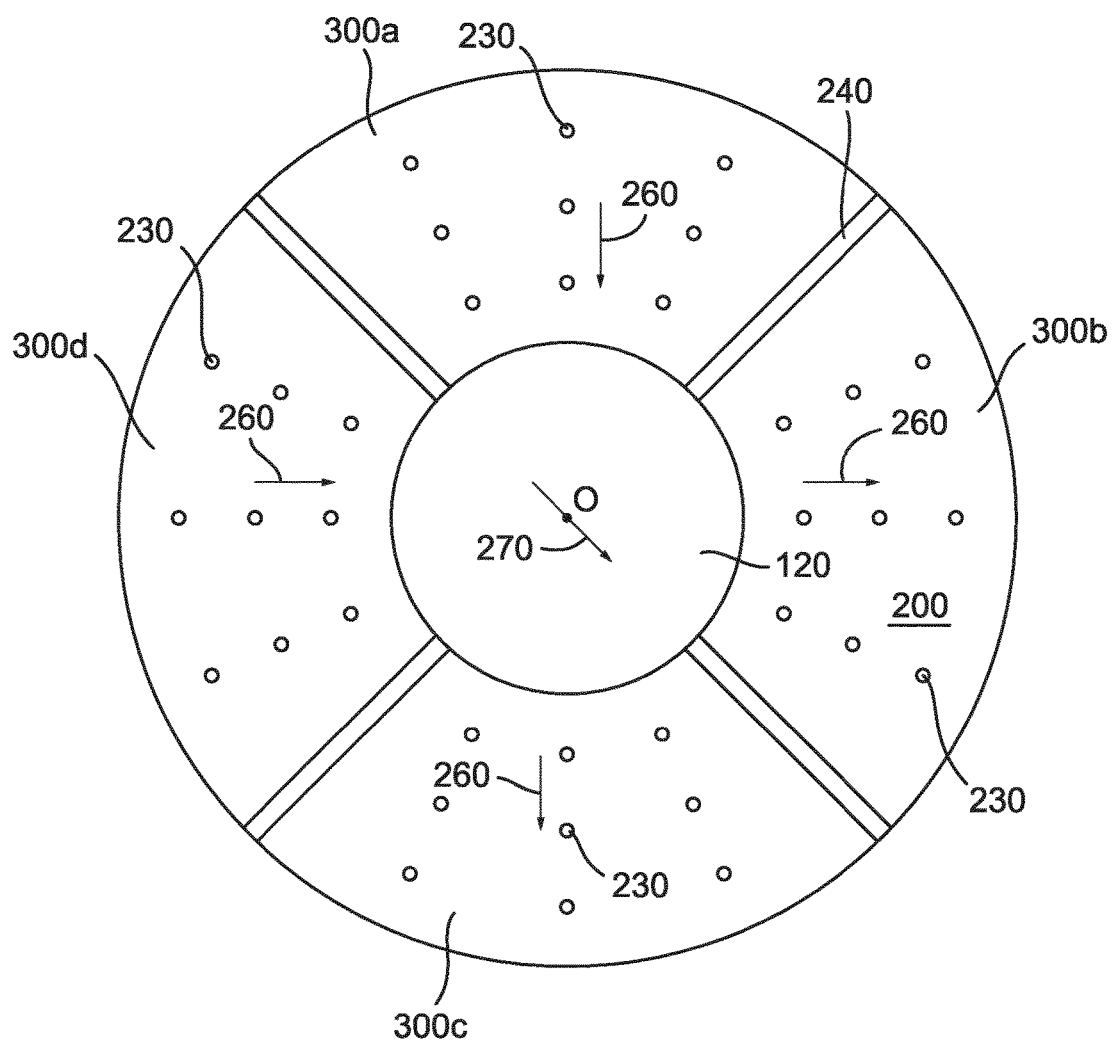
FIG. 4 depicts, in plan, a passageway-former according to an embodiment of the present invention.

The liquid supply and/or recovery unit 450 may be used to supply liquid to the further opening 320, through the passageway 300, out of the passageway 300, through opening 310 and into the immersion space 10. The liquid supply and/or recovery unit 450 may be used to recover liquid from the immersion space 10, through opening 310, through passageway 300 and out of passageway 300 through the further opening 320. In an embodiment the further opening controller 400 may be used to change a liquid flow pattern in the immersion space 10. For example, the further opening controller 400 may induce a flow of liquid across the immersion space 10 from one side of the immersion space 10 to the other side of the immersion space 10. This may be achieved by providing two or more passageways 300 through which flow of liquid is individually controllable by the further opening controller 400. For example, a first passageway 300 could provide a flow of liquid into the immersion space 10 through opening 310. A second passageway 300, for example on the opposite side of the immersion space 10 to the first passageway 300, could be used to remove liquid from the immersion space 10 through opening 310. In this way, a flow of liquid across the immersion space 10 from side of the immersion space 10 to the other side of the immersion space 10 can be achieved. In an arrangement the liquid flow through the passageways 300 can be integrated into the flow path of the body of liquid in the immersion space 10. This flow path may be across the immersion space 10 perpendicular to the scanning movement of the substrate table WT during an exposure. FIG. 4 described below shows an embodiment with a plurality of passageways 300 with which such a flow can be achieved.

The further opening controller 400 is adapted to control fluid flow rate through the further opening 320. In an embodiment the further opening controller 400 controls the flow rate (or speed) of liquid in the passageway 300. The flow speed may be controlled to be less than 0.5 m/s. At such low flow rates the generation of vibrations by flow of liquid in the passageway 300 is minimised.

In an embodiment a substrate table controller 500 is provided. The substrate table controller 500 may be adapted periodically to move the substrate table WT relative to the projection system PS. The periodic movement of the substrate table WT forces liquid into and out of a part of the gap between the passageway-former 200 and the liquid confinement structure 12 at the same time as forcing liquid synchronously out of and into a different part of the same gap. This causes the meniscus 22 to oscillate with the periodic movement of the stage; and to move in opposite directions in the two different parts of the gap. This motion of the meniscus is sometimes referred to as 'sloshing'. In an embodiment the periodic movement of the substrate table WT relative to the projection system PS is such as to force liquid from the immersion space 10 into the passageway 300. The liquid is forced into the passageway 300 at the same time as liquid is forced into the gap between the former facing surface 220 and the liquid confinement structure 12. In this way liquid in the passageway 300 may be replenished. The liquid supply and/or recovery system 450 may be adapted to recover liquid from the further opening 320. This may be by way of applying an under pressure to the further opening 320 as described elsewhere. In an alternative embodiment, the recovery of liquid from the further opening 320 may be by way of providing a drain to catch and remove any liquid which exits the further opening 320. This may be particularly advantageous in the embodiment of FIG. 6 described below.

In the embodiment of FIG. 3 the passageway-former 200 is separate from the final lens element 100. That is, the passageway-former 200 is non-integral with the final lens element 100. The passageway 300 is formed between the upper surface 210 of the passageway-former 200 and the exposed bottom surface of the final lens element 100. In particular, the internal surfaces of the passageway 300 is formed by at least part of the non-optically active bottom surface 150 of the final lens element 100 and the upper surface 210 of the passageway-former 200.

The passageway-former 200 is shaped such that its distance from the exposed bottom surface of the final lens element 100 is substantially constant. The shape, in cross-section, of the upper surface 210 of the passageway-former 200 is substantially the same as that of the corresponding exposed bottom surface of the final lens element 100. In an embodiment the passageway-former 200 is of constant thickness (for example about 200 μm thick).

In an embodiment the passageway-former 200 may be made of a material with a high thermal conductivity. The material of the passageway-former 200 may have a thermal conductivity of greater than 250 Wm$^{-1}$k$^{-1}$. For example, the material of the passageway-former 200 may be made of a metal, such as silver, or of diamond. Any thermal load applied locally to the passageway-former 200 in this embodiment is quickly dissipated by thermal conduction in all directions in the passageway-former 200 including in the radial direction. Thus, the heat load is dissipated. As a result, any thermal load which reaches the optically active part 130 of the final lens element 100 will be less localised and any resulting aberrations or focus errors will be lower.

In an alternative embodiment the material of the passageway-former 200 has a low thermal conductivity. In one embodiment the material of the passageway-former 200 has a thermal conductivity of less than 1 Wm$^{-1}$k$^{-1}$. For example, the material of the passageway-former 200 may be a plastic. This has the advantage that any heat load applied to the former facing surface 220 of the passageway-former 200 will be conducted more slowly to the optically active part 130 than would be the case for a material with a higher thermal conductivity. As a result, a lower thermal cooling load will reach the optically active part 130 of the final lens element 100.

In an embodiment, the passageway-former 200 may have on its former facing surface 220 a coating with a high thermal conductivity. Such a coating may have a thermal conductivity of greater than 250 Wm$^{-1}$k$^{-1}$. Such a coating functions in the same way as if the passageway-former 200 itself is made of a material with a high thermal conductivity, as described above.

The passageway-former 200 may be supported between the final lens element 100 and the liquid confinement structure 12 in any way. In the embodiment of FIG. 3, the passageway-former 200 is supported by the projection system PS. In particular, the passageway-former 200 is attached to a final lens element support 600. The final lens element support 600 is a frame of the projection system PS. The final lens element support 600 supports the final lens element 100. The passageway-former 200 is supported at its radially outermost end by the final lens element support 600. In the embodiment of FIG. 3 the further opening 320 is connected to the liquid supply and/or receiving system 300 via a connecting passageway 350 formed between the final lens element support 600 and the final lens element 100. The connecting passageway 350 may be located at one or more discrete locations. That is, it may not extend entirely around the final lens element 100. There may be more than one connecting passageway 350, for example radially spaced uniformly or non-uniformly around the final lens element 100.

Alternatively or additionally to being supported by the final lens element support 600, the liquid supply and/or recovery system 450 applies an under pressure between the passageway-former 200 and the exposed bottom surface of the final lens element 100. The under pressure is an under pressure above the passageway-former 200 compared to an ambient pressure underneath the passageway-former 200. The presence of the under pressure applies an attractive force to the passageway-former 200 towards the projection system PS thereby to hold the passageway-former 200 to the final lens element 100.

In an embodiment one or more spacers 230 (illustrated in FIG. 4) on the upper surface 210 of the passageway-former 200 project into the passageway 300 and contact the exposed bottom surface of the final lens element 100. The spacers 230 serve to ensure the correct distance between the passageway-former 200 and the final lens element 100. The spacers 230 may be periodically spaced between every 2 and 5 mm, for example. The spacers 230 may be made of the same material as the passageway-former 200 or a different material. In an example, the material of the spacers 230 may be a material with a lower thermal conductivity than that of the material of the passageway-former 200. The spacers 230 may serve to isolate the body of the final lens element 100 thermally from the passageway-former 200.

The passageway-former 200 may be supported by the liquid confinement structure 12. Any connection between the passageway-former 200 and the liquid confinement structure 12 may be a compliant and/or resilient connection. Such a connection protects the final lens element 100 from the risk of collision damage from the passageway-former 200. In such a collision, the liquid confinement structure 12 would move towards the projection system PS in an unwanted way and at a magnitude of speed which might result in the passageway-former 200 hitting the exposed bottom surface of the final lens element 100. The passageway-former 200 with the compliant and/or resilient connection may move towards the liquid confinement structure 12 in the event of a collision so that damage to the final lens element 100 can be reduced compared to the case where the connection is stiff.

In an embodiment the liquid in the immersion space 10 has a lyophillic surface property (such as hydrophilic when the immersion liquid is water) on at least a part of the surfaces forming the passageway 300. Such a surface would have contact angle of less than 90 degrees with respect to the immersion liquid. For example, the non-optically active bottom surface 150 and/or top surface 210 may be lyophillic surfaces with respect liquid in the immersion space 10. In an embodiment the liquid in the immersion space 10 has a contact angle of less than 85°, desirably less than 70°, more desirably less than 50° or even more desirably less than 30° with at least a part of the surfaces forming the passageway 300. In an embodiment the liquid in the immersion space 10 is water and at least part of the surfaces forming the passageway 300 are hydrophilic. The at least part of the surfaces forming the passageway 300 with which immersion liquid has a contact of less than 90° may have a coating on it to give it that property.

In an embodiment one or more grooves are present in a surface defining the passageway 300. Such grooves may be present in the top surface 210 of the passageway-former 200 and/or in the non-optically active bottom surface 150 of the final lens element 100. The groove(s) extend radially. The radial extension of the groove(s) is effective in guiding liquid towards or away from the immersion space 10. That is, the grooves encourage the liquid to flow in a radial direction relative to the optically active bottom surface 120.

In an embodiment the former facing surface 220 of the passageway-former 200 is a surface with which is lyophobic with respect to liquid in the immersion space 10 (e.g. a surface contact angle of more than 90 degrees with respect to liquid). In an embodiment, the contact angle of liquid in the immersion space 10 with the former facing surface 220 of the passageway-former 200 is greater than 95°. In an embodiment the liquid in the immersion space 10 is water and the former facing surface 220 is lyophobic with respect to water (i.e. hydrophobic). In this way, liquid will find it harder to adhere to the bottom surface 220 of the passageway-former 200. As a result, fewer cooling loads due to a droplet on the bottom surface 220 are likely to be present. The former facing surface 220 may have a coating on it to ensure that the immersion liquid has a surface contact angle of more than 90° with it.

As can be seen in FIG. 3, the passageway-former 200 at its radially inner most position (with reference to the optically active bottom surface 120) may extend lower than the optically active part 130 of the final lens element 100. The passageway-former 200 is closer to the facing surface formed of at least one of the substrate W and substrate table WT than the optically active bottom surface 120 of the final lens element 100. Having the opening 310 low down ensures that even if the meniscus 22 moves down (for example during movement of the substrate table WT to the right as illustrated), liquid in the passageway 300 will always be in contact with liquid in the immersion space 10. When liquid is sucked up the passageway 300 by capillary action and a gas is introduced into the passageway 300 through the opening 310, the introduced gas could reduce the effectiveness of capillary action in filling the passageway 300. Where a flow of liquid through the passageway 300 is used to control flow of liquid in the immersion space 10, having the opening 310 closer to the center of the immersion space 10 by extending the passageway-former 200 to below the optically active part 130 allows improved control of flow in the immersion space 10.

When the liquid flow through the passageway 300 is used to control flow of liquid in the immersion space 10, more than one of passageways 300 might be provided, surrounding the optically active surface 120 in plan. In such an embodiment it is possible to control the direction of flow across the immersion space 10 by having a flow of liquid into the immersion space 10 through selected ones of passageways 300 and having flow of liquid out of the immersion space 10 through certain others of passageways 300. The provision of a plurality of passageways 300 may result in having at least two ribs 240, each rib 240 formed between adjacent passageways 300. Such a rib 240 extends in the radial direction between passageways 300. The ribs 240 may be integral with the passageway-former 200. The ribs 240 increase the rigidity of the passageway-former 200. They may provide a stronger structure to the passageway-former 300.

FIG. 4 illustrates, in plan, a passageway-former 200. The passageway-former has four passageways 300a, 300b, 300c and 300d. Flow of liquid through the passageways 300a-300d may be individually controlled by the further opening controller 400. The four passageways 300a-300d are each separated from one another with ribs 240 which are radially spaced apart. The distances between the ribs 240 may be periodic. The distance between adjacent ribs 240 may be equidistant. The ribs 240 extend from the opening 310 to the further opening 320 of respective passageways 300a-300d. FIG. 4 shows the spacers 230 which extend between the upper surface 210 and the non-optically active surface 150. The spacers 230 may be of any size and in any pattern, in plan. In an embodiment each spacer 230 is conical in shape. Each spacer 230 may provide a point of contact to the exposed bottom surface. (This is in the same way of contact between substrate W and substrate table WT through conical burls or pimples formed in the surface of the substrate table WT. Such a shape reduces the surface area contact between the passageway-former 200 and the final lens element 100, in effect thermally isolating the final lens element 100 from the passageway-former 200.)

Arrows 260 in FIG. 4 illustrate the flow direction of liquid in each of the passageways 300a-300d. As can be seen, the flow of liquid in passageways 300a and 300d is from the further opening 320 and out of the opening 310 into the immersion space 10. The flow of liquid in passageways 300b and 300c is out of the immersion space 10 through opening 310, along the passageway 300b, 300c and out of the respective further opening 320. This results in an overall flow of liquid across the immersion space 10 in direction of arrow 270.

Figure 5:
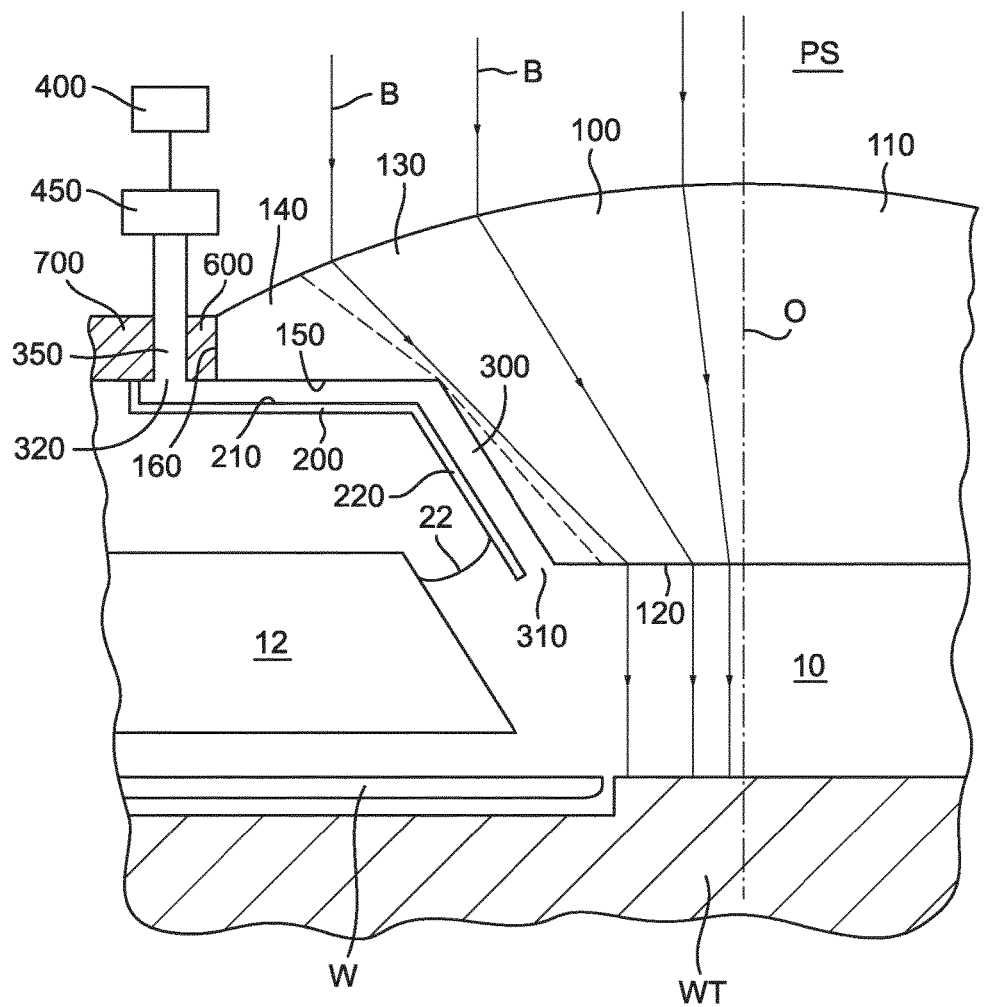
FIG. 5 depicts, in cross-section, a passageway-former according to an embodiment of the present invention.

FIG. 5 illustrates a further embodiment of the present invention which is the same as that of FIG. 3 except as described below.

In the FIG. 5 embodiment the passageway-former 200 is not supported by the final lens element support 600 but by another component of the projection system PS. In the embodiment of FIG. 5 the passageway-former 200 is supported by a passageway-former support 700. The passageway-former support 700 is radially outwards of the final lens element support 600. The further opening 320 is formed between the final lens element support 600 and the passageway-former support 700.

Figure 6:
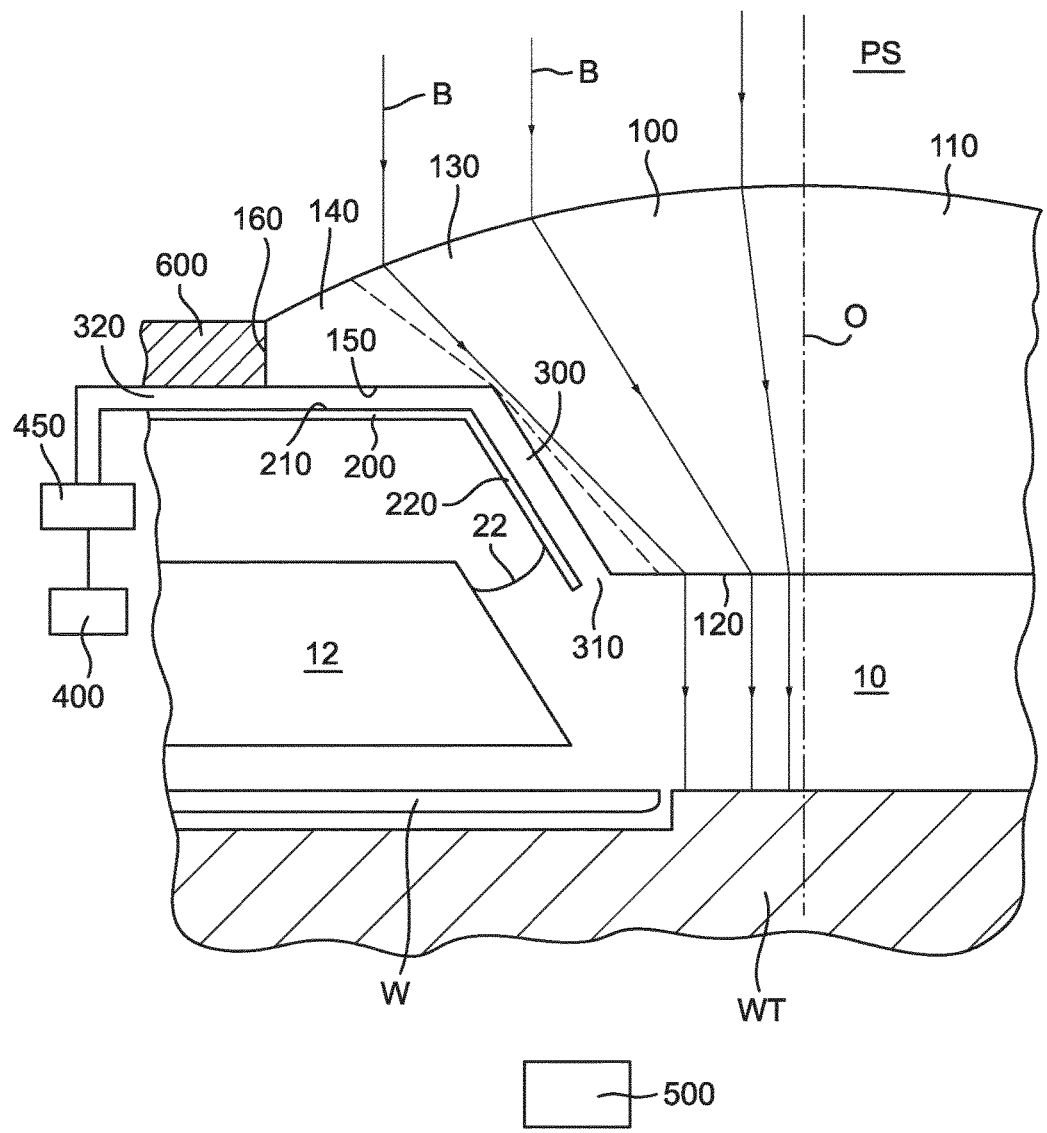
FIG. 6 depicts, in cross-section, a passageway-former according to an embodiment of the present invention.

The embodiment shown in FIG. 6 is the same as that of the embodiment of FIG. 3 except as described below.

In the embodiment of FIG. 6, the passageway-former 200 is supported independently of the projection system PS and independently of the liquid confinement structure 12. Fewer vibrations of the passageway-former 200 will be transmitted to the projection system PS, including the final lens element 100. The passageway-former 200 may be supported in any way and may be mechanically decoupled from the projection system PS and/or liquid confinement structure 12. The decoupling of the passageway-former 200 from the projection system PS and the liquid confinement structure 12 may be achieved using springs and/or dampers.

Figure 7:
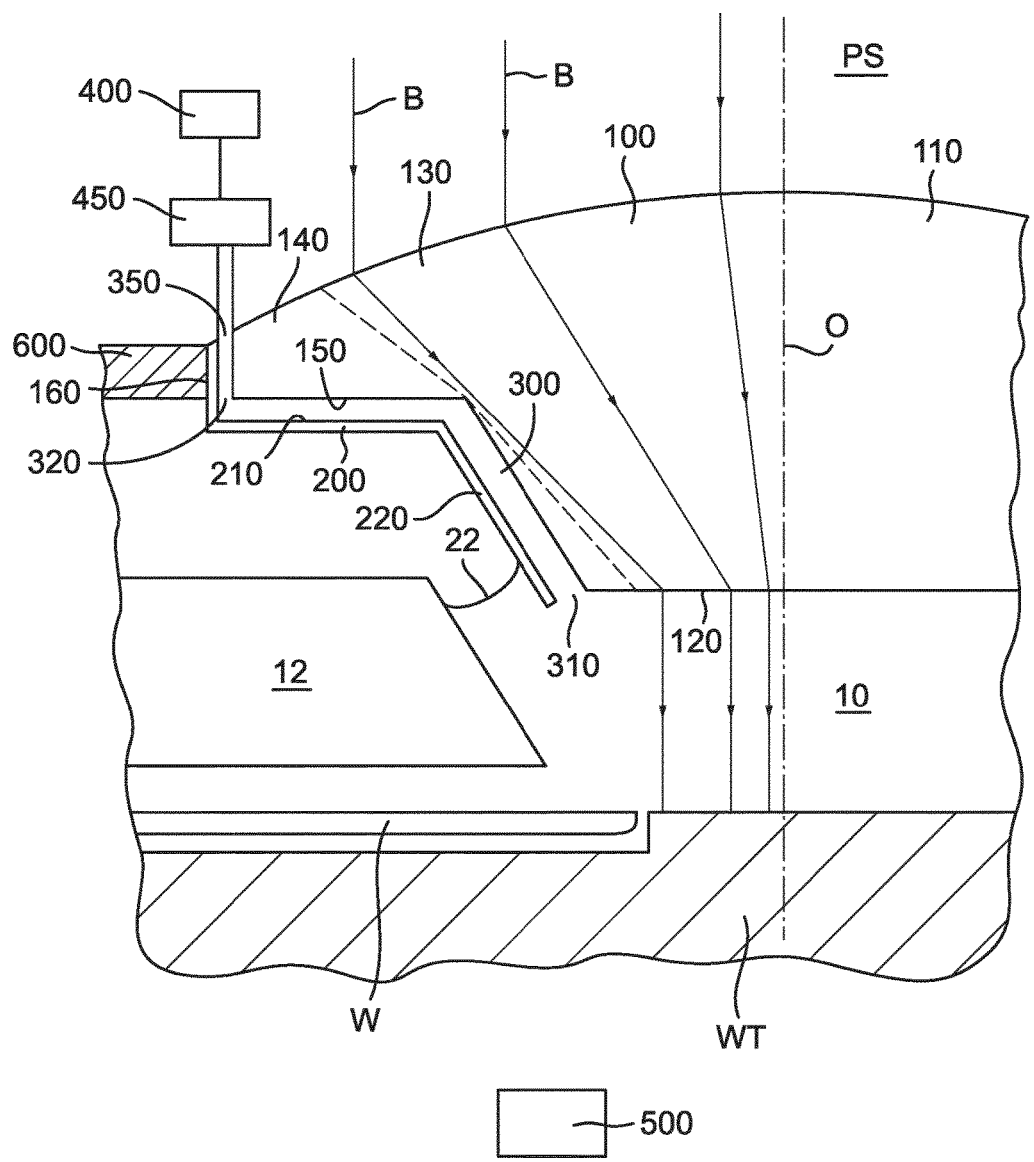
FIG. 7 depicts, in cross-section, a passageway-former according to an embodiment of the present invention.

The embodiment of FIG. 7 is the same as that of FIG. 3 except as described below.

In the embodiment of FIG. 7 the passageway-former 200 is integral with the final lens element 100. The final lens element 100 and the passageway-former 200 are made from the same block of material. The passageway 300 may pass through the body of the final lens element 100. One or more passageways 300 are formed in the block of material radially outwardly of the optically active part 130. Desirably the passageway-former 200 does not require separate support. Any spacers 230 or ribs 240 from the top surface 210 extending to the non-optically active bottom surface 150 (or vice-versa) provide a resilient connection between the passageway-former 200 and the final lens element 100. The passageway 300 may be formed by drilling.

Figure 8:
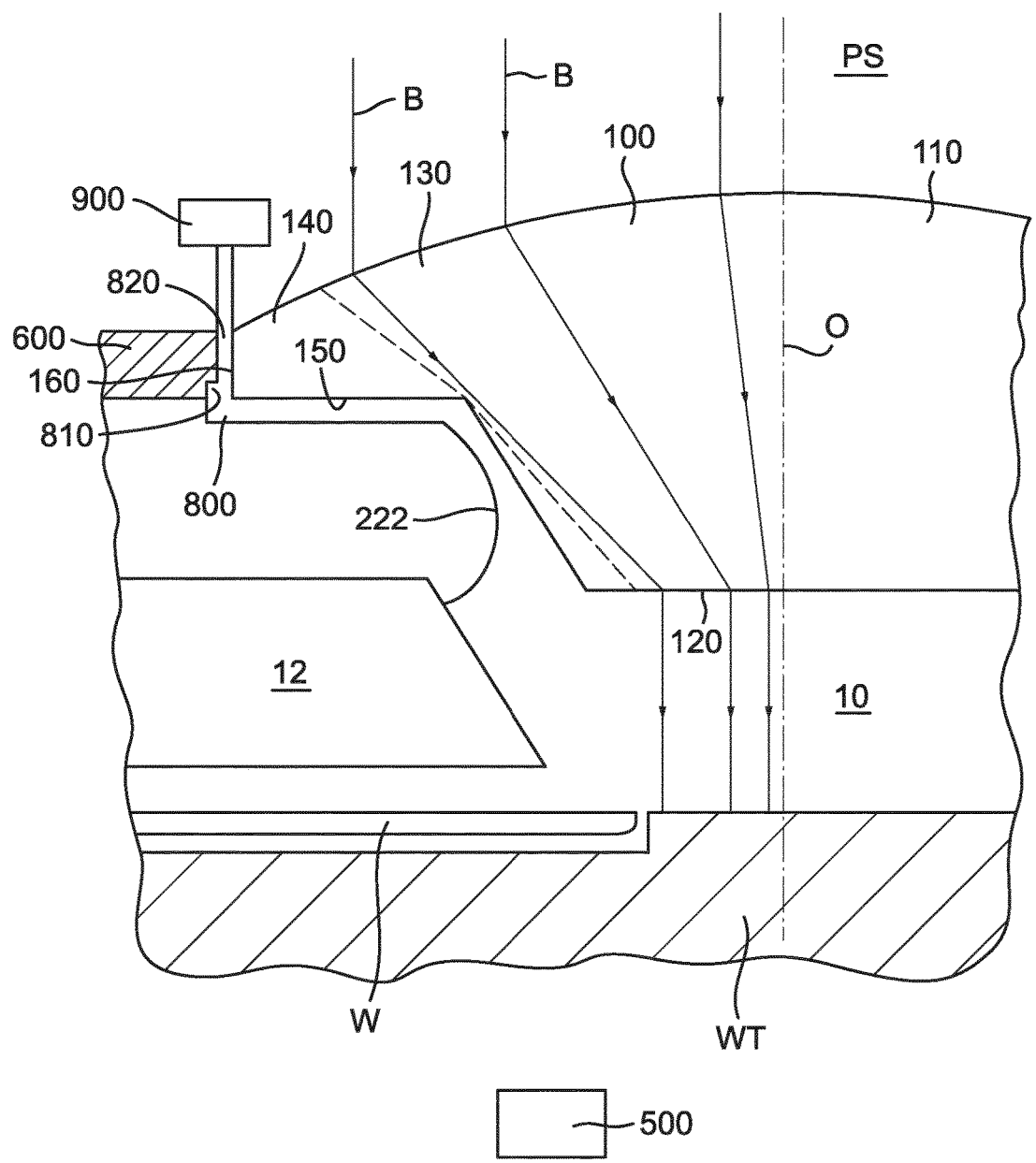
FIG. 8 depicts, in cross-section, a final lens element according to an embodiment of the present invention.
Figure 9:
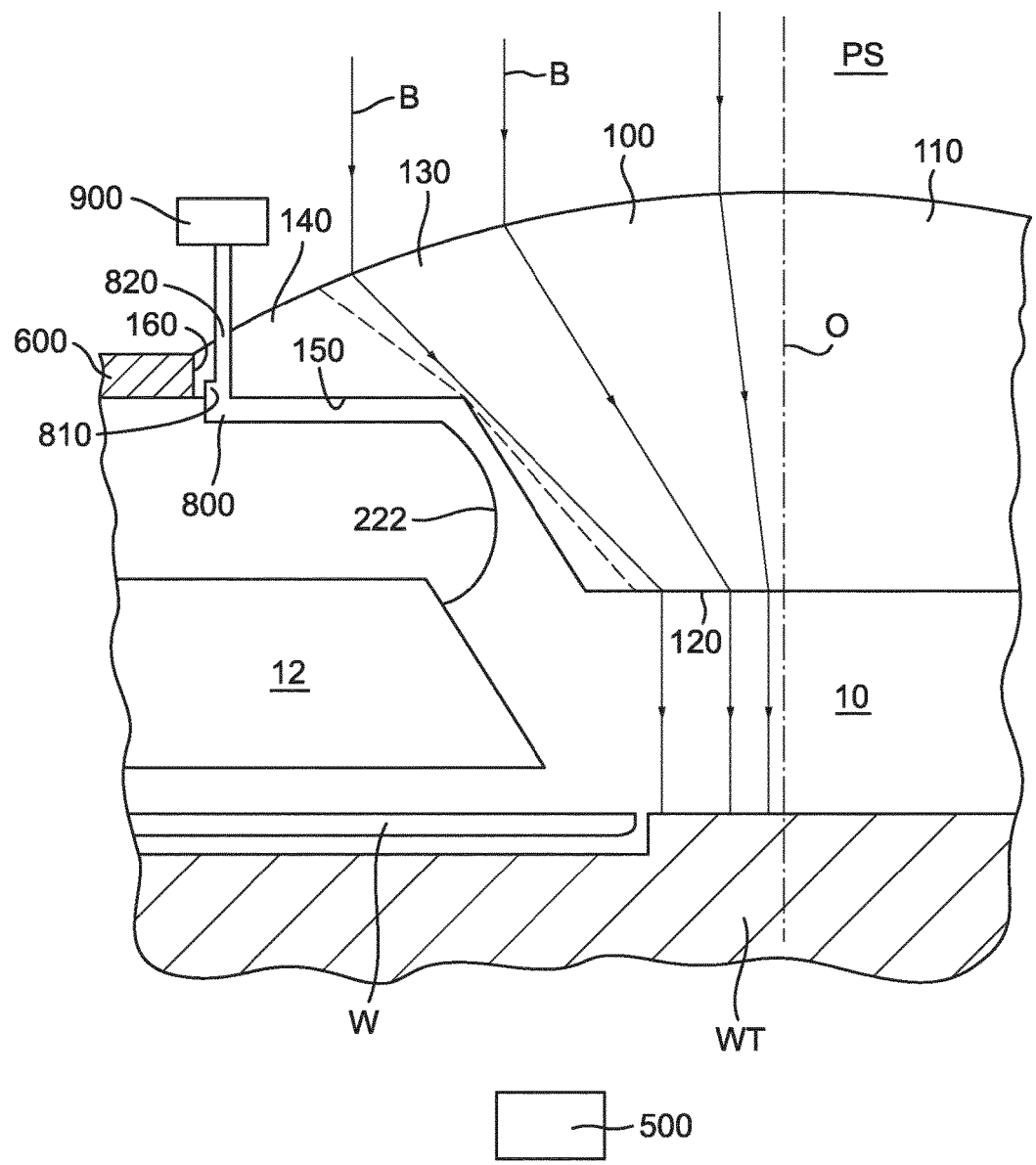
FIG. 9 depicts, in cross-section, a final lens element according to an embodiment of the present invention.
Figure 10:
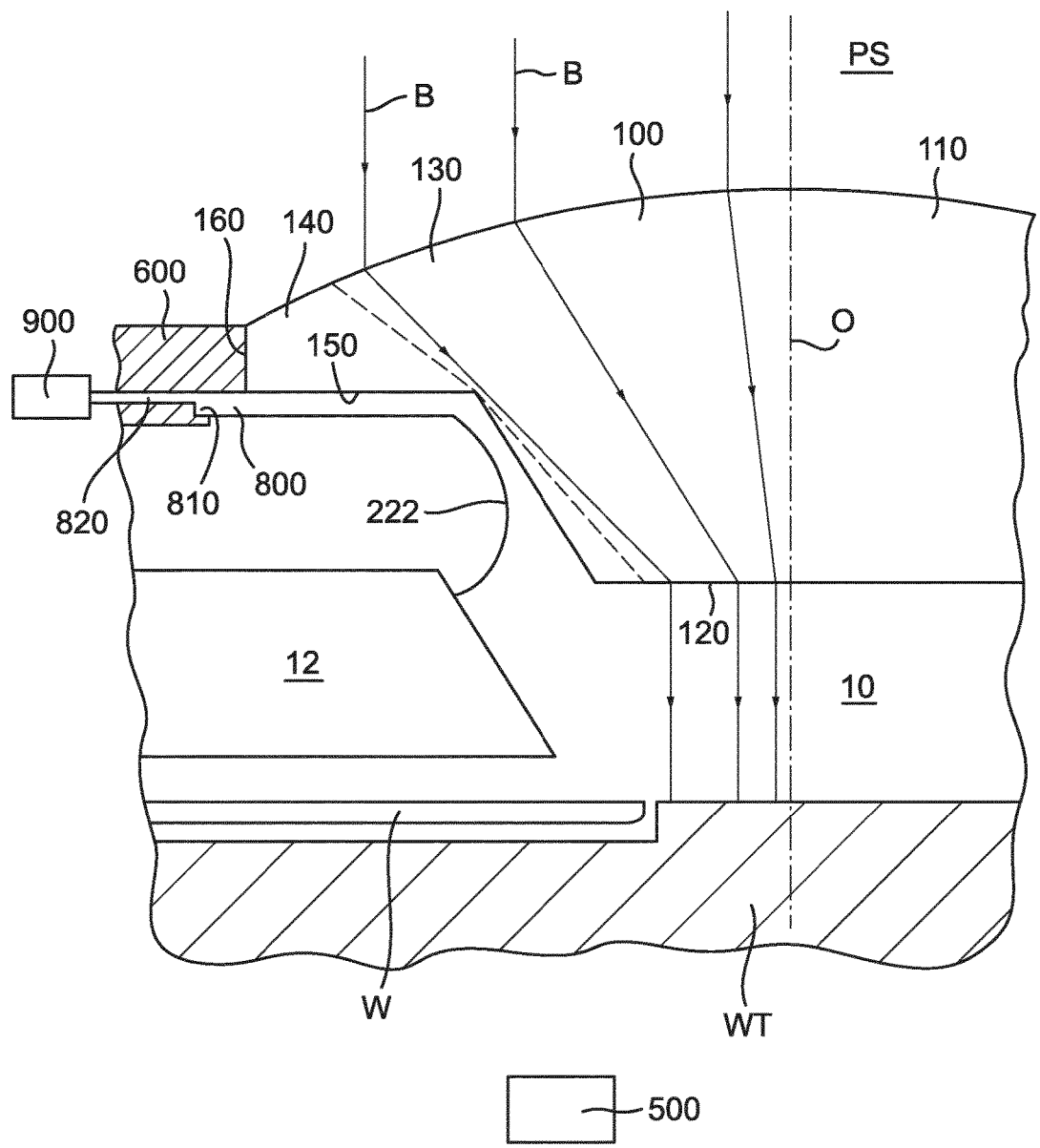
FIG. 10 depicts, in cross-section, a final lens element according to an embodiment of the present invention.

FIGS. 8, 9 and 10 illustrate further embodiments of the present invention. The embodiments of FIGS. 8, 9 and 10 operate using similar principles to the embodiment of FIG. 3. The embodiments of FIGS. 8, 9 and 10 are the same as the embodiment of FIG. 3 except as described below.

In the embodiments of FIGS. 8, 9 and 10 are without a passageway 300 or a passageway-former 200. Instead, a flow of liquid adheres to the exposed bottom surface of the final lens element 100 is provided during use in order to achieve the same thermal conditioning as the liquid in the passageway 300 in the embodiment of FIG. 3.

The embodiments of FIGS. 8, 9 and 10 are the same as each other except that the position of a liquid supply opening 800 is different as described below. In all embodiments the liquid supply opening 800 is radially outward of the optically active bottom surface 120.

In the embodiment of FIG. 8 a liquid supply opening 800 is provided radially outwardly of the final lens element 100 and radially inwardly of the final lens element support 600. A liquid supply 900 is provided to supply liquid to the liquid supply opening 800. The liquid supply opening 800 may comprise a recess 810 connected to one or more liquid supply passageways 820. The recess 810 may extend all the way around the final lens element 100, in plan. The one or more liquid supply passageways 820 may be discrete passageways 820 regularly or irregularly spaced around the final lens element 100, in plan.

There may be a single liquid supply opening 800 which extends substantially around the circumference of the final lens element 100. Alternatively a plurality of liquid supply openings 800 may be spaced regularly or irregularly around the final lens element 100.

In use, a liquid exits liquid supply opening 800 and flows radially inwardly along and in contact with the exposed bottom surface of the final lens element 100. The liquid flowing out of the liquid supply opening 800 along the exposed bottom surface of the final lens element 100 flows into the immersion space 10. A meniscus 222 thereby extends between the liquid confinement structure 12 and the liquid supply opening 800.

The liquid supply opening 800 is radially outward of the optically active bottom surface 120 of the final lens element and radially outward of the non-optically active bottom surface 150 of the final lens element 100. That is, the liquid supply opening 800 is radially outward of the edge 160 of the exposed bottom surface of the final lens element 100. Any liquid drops which might otherwise have landed on the non-optically active surface 150 are simply absorbed into the flow of liquid along the bottom exposed surface of the final lens element 100. No local cooling thermal loads can be formed due to an isolated droplet on the exposed bottom surface.

In an embodiment the liquid in the immersion space 10 has a lyophilic surface property (such as hydrophilic when the immersion liquid is water) on part of the bottom surface of the final lens element 100 radially outwardly of the optically active bottom surface 120. Such a surface would have contact angle of less than 90 degrees with respect to the immersion liquid. In an embodiment the contact angle is less than 85°, desirably less than 70°, more desirably less than 50° or even more desirably less than 30°. In the case that liquid in the immersion space 10 is water, the surface is hydrophilic. The part of the bottom surface of the final lens element 100 radially outwardly of the optically active bottom surface 120 with which the immersion liquid has a contact angle of less than 90° may have a coating on it to give it that property.

In an embodiment at least one groove is present in the exposed bottom surface of the final lens element 100. The groove extends radially relative to the optical axis O. The radial extension of the groove is effective to guide liquid exiting the liquid supply opening towards the immersion space 10.

In the embodiment of FIG. 9, the liquid supply opening 800 is formed in the final lens element 100.

In the alternative embodiment of FIG. 10, the supply passageway 820 is formed in the final lens element support 600 or beneath the final lens element support 600. The liquid supply passageway 820 has a liquid supply opening 800 through which liquid is supplied to the bottom exposed surface of the final lens element 100.

In an embodiment liquid supplied to the passageway 300 or through the liquid supply opening 800 onto the exposed bottom surface of the final lens element 100 may be thermally conditioned liquid. Thermal conditioning is achieved by liquid conditioners present in the liquid supply system. The liquid may have its temperature set within a predetermined range of a predetermined set point temperature. The predetermined set point temperature of the liquid provided to the passageway 300 and/or through the liquid supply opening 800 may be the same as a predetermined temperature of liquid supplied to the immersion space 10 by the liquid confinement structure 12. This is convenient as the same thermal conditioning unit for conditioning the temperature of liquid may be used for liquid supplied to the liquid confinement structure 12 as is used for liquid supplied to the passageway 300 and the liquid supply opening 800.

In the description the directions have been explained relative to an optical axis O. The invention has also been described assuming symmetry around the axis O. However, the apparatus may have off-axis symmetry. For that reason, reference to the optical axis O may also include or alternatively may be to the location of the optically active bottom surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
   a projection system configured to project a patterned radiation beam through an optically active part of a final lens element of the projection system towards a substrate supported by a substrate table;
   a liquid confinement structure configured to supply and confine immersion liquid to an immersion space between the final lens element of the projection system and a surface of the substrate and/or the substrate table;
   a passageway-former between the projection system and the liquid confinement structure, and a passageway between the passageway-former and the optically active part of the final lens element, the passageway being in liquid communication via a first opening with the immersion space to allow a liquid flow through the passageway to or from the immersion space; and
   a second opening of the passageway at an end of the passageway opposite to the first opening, wherein the end of the passageway is sealed off except for the second opening, wherein the second opening is configured to provide liquid to and/or receive liquid from the passageway and wherein the second opening is mated to tubing or sealed onto a support of the passageway-former.

2. The immersion lithographic apparatus of claim 1, wherein the passageway extends radially outwardly, with respect to an optical axis of the projection system, of an edge of an exposed bottom surface of the final lens element.

3. The immersion lithographic apparatus of claim 1, wherein the passageway-former is integral with the final lens element of the projection system.

4. The immersion lithographic apparatus of claim 1, wherein the passageway is between the passageway-former and a non-optically active part of the final lens element through which the patterned beam of radiation does not pass.

5. The immersion lithographic apparatus of claim 1, wherein the passageway-former is supported by the projection system.

6. The immersion lithographic apparatus of claim 5, wherein the passageway-former is attached to the final lens element.

7. The immersion lithographic apparatus of claim 1, wherein the passageway-former is supported independently of the projection system and the liquid confinement structure.

8. The immersion lithographic apparatus of claim 1, further comprising an under pressure source configured to apply an under pressure on one side of the passageway-former compared to an ambient pressure on the opposite side of the passageway-former thereby to apply an attractive force to the passageway-former towards the projection system.

9. The immersion lithographic apparatus of claim 1, wherein the passageway-former at its radially inner most position, relative to an optical axis of the projection system, extends lower than the optically active part of the final lens element.

10. The immersion lithographic apparatus of claim 1, wherein liquid in the immersion space has a contact angle of greater than 90° on a facing surface of the passage-way former which faces the liquid confinement structure.

11. The immersion lithographic apparatus of claim 1, wherein liquid in the immersion space has a contact angle of less than 90° on at least a part of a surface forming the passageway.

12. An immersion lithographic apparatus comprising:
   a projection system configured to project a patterned radiation beam through an optically active part of a final lens element of the projection system towards a substrate supported by a substrate table, the final lens element having an exposed bottom surface;
   a liquid confinement structure configured to supply and confine immersion liquid to an immersion space between the final lens element of the projection system and a surface of the substrate and/or the substrate table;
   a passageway-former between the projection system and the liquid confinement structure, and a passageway between the passageway-former and the optically active part of the final lens element, the passageway being in liquid communication via a first opening with the immersion space and extending radially outwardly, with respect to an optical axis of the projection system, at least to an edge of the exposed bottom surface of the final lens element and being constructed and configured such that, when liquid is in the immersion space, it is filled with liquid from the immersion space by capillary action; and a second opening in liquid communication with the passageway at an end of the passageway opposite to the first opening, wherein the second opening is configured to receive liquid from the passageway and wherein the second opening is mated to tubing or sealed onto a support of the passageway-former.

13. The immersion lithographic apparatus of claim 12, wherein the passageway extends radially outwardly, with respect to an optical axis of the projection system, of an edge of an exposed bottom surface of the final lens element.

14. The immersion lithographic apparatus of claim 12, wherein liquid in the immersion space has a contact angle of greater than 90° on a facing surface of the passage-way former which faces the liquid confinement structure.

15. The immersion lithographic apparatus of claim 12, wherein liquid in the immersion space has a contact angle of less than 90° on at least a part of a surface forming the passageway.

16. An immersion lithographic apparatus comprising:
a projection system configured to project a patterned radiation beam through an optically active bottom surface of a final lens element of the projection system and towards a substrate supported by a substrate table;
a liquid confinement structure between the projection system and the substrate and/or the substrate table, the liquid confinement structure configured to supply and confine immersion liquid to an immersion space between the final lens element of the projection system and a surface of the substrate and/or the substrate table; and
a liquid supply opening radially outward of the optically active bottom surface of the final lens element adapted for the flow therethrough of a liquid over an exposed bottom surface of the final lens element towards the optically active bottom surface of the final lens element and into the immersion space; and
a liquid supply system configured to supply the liquid through the liquid supply opening such that liquid flows along the bottom surface with an open gap between the liquid flow and a surface of the liquid confinement structure.

17. The immersion lithographic apparatus of claim 16, wherein at least part of the exposed bottom surface is lyophilic with the supplied liquid.

18. An immersion lithographic apparatus comprising:
a projection system configured to project a patterned radiation beam through a final lens element of the projection system towards a substrate supported by a substrate table;
a liquid confinement structure configured to supply and confine immersion liquid to an immersion space between the final lens element of the projection system and a surface of the substrate and/or the substrate table;
a passageway-former between the projection system and the liquid confinement structure and a passageway between the passageway-former and the final lens element, the passageway being in liquid communication with the immersion space to allow a flow of liquid through the passageway to the immersion space; and
an opening in liquid communication with the passageway at an end of the passageway, the end of the passageway sealed off except for the opening and the opening configured to supply the flow of liquid into the passageway.

19. The immersion lithographic apparatus of claim 18, wherein the passageway extends radially outwardly, with respect to an optical axis of the projection system, of an edge of an exposed bottom surface of the final lens element.

20. The immersion lithographic apparatus of claim 18, wherein liquid in the immersion space has a contact angle of greater than 90° on a facing surface of the passage-way former which faces the liquid confinement structure.

* * * * *